(12) United States Patent
Miyamoto

(10) Patent No.: US 8,400,163 B2
(45) Date of Patent: Mar. 19, 2013

(54) VOLTAGE DETECTING CIRCUIT

(75) Inventor: Manabu Miyamoto, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 664 days.

(21) Appl. No.: 12/585,631

(22) Filed: Sep. 21, 2009

(65) Prior Publication Data

US 2010/0073004 A1   Mar. 25, 2010

(30) Foreign Application Priority Data

Sep. 25, 2008   (JP) .................................. 2008-245341

(51) Int. Cl.
   *G01N 27/416* (2006.01)
(52) U.S. Cl. ......................... 324/434; 324/433; 320/117
(58) Field of Classification Search .................. 324/434
   See application file for complete search history.

(56) References Cited

U.S. PATENT DOCUMENTS

| | | | |
|---|---|---|---|
| 6,803,766 B2 | 10/2004 | Kobayashi et al. | |
| 7,550,945 B2 | 6/2009 | Iwabuchi et al. | |
| 7,592,774 B2 | 9/2009 | Morimoto | |
| 2007/0018613 A1* | 1/2007 | Miyazaki et al. | 320/116 |
| 2007/0029967 A1* | 2/2007 | Morimoto | 320/116 |

FOREIGN PATENT DOCUMENTS

| | | |
|---|---|---|
| JP | 2001-201522 | 7/2001 |
| JP | 2002-357624 A | 12/2002 |
| JP | 2006-105824 A | 4/2006 |
| JP | 2007-040842 A | 2/2007 |

OTHER PUBLICATIONS

Japanese Office Action dated Sep. 11, 2012 with an English translation thereof.

* cited by examiner

*Primary Examiner* — Drew A Dunn
*Assistant Examiner* — Robert Grant
(74) *Attorney, Agent, or Firm* — McGinn IP Law Group PLLC

(57) ABSTRACT

A voltage detecting circuit includes a switch group that selects any one of a plurality of battery cells connected in series, a sampling capacitor that maintains a potential difference between a positive electrode terminal and a negative electrode terminal of a battery cell selected by the switch group, a measuring part that outputs a detected voltage value signal corresponding to the potential difference between ends of the sampling capacitor, a transfer switch that transfers, to the measuring part, the potential difference caused between the ends of the sampling capacitor, a correction capacitor provided in parallel to input terminals of the measuring part, and between the transfer switch and the measuring part, and a discharge switch provided in parallel to the correction capacitor, and controlled so that a switching condition of the discharge switch is mutually exclusive with that of the transfer switch.

17 Claims, 6 Drawing Sheets

VOLTAGE DETECTING CIRCUIT

INCORPORATION BY REFERENCE

This application is based upon and claims the benefit of priority from Japanese Patent Application No. 2008-245341 which was filed on Sep. 25, 2008, the disclosure of which is incorporated herein in its entirety by reference.

BACKGROUND OF THE INVENTION

1. Field of the Invention

The present invention relates a voltage detecting circuit, and particularly relates to a voltage detecting circuit that measures a voltage of each battery cell of a plurality of battery cells connected in series.

2. Description of Related Art

In recent years, lithium ion batteries have been used for the purpose of being mounted on a vehicle such as a hybrid car. However, since the lithium ion batteries have a limitation of a voltage that can be outputted by one cell, a battery pack of the battery cells connected in a multi-stage is used as a battery for use in a vehicle that needs high voltage, or for other similar usage. Here, when an overcharge occurs in such a lithium ion battery, safety and life thereof may deteriorate. For that reason, the battery pack using the lithium ion battery needs to avoid risks caused by overcharge and the like by monitoring a voltage value outputted from each battery cell.

To this end, there have been proposed a variety of voltage detecting circuits that detect the voltages of battery cells included in a battery pack. As for these voltage detecting circuits, one voltage detecting circuit is designed to detect voltages of multiple battery cells in order to reduce the number of components of a power source module including the battery pack and the voltage detecting circuit. When one voltage detecting circuit measures multiple battery cells, as described above, the voltage detecting circuit is provided with, as a ground voltage, a voltage of a negative electrode terminal of a battery cell disposed on the lowest potential side of the measured battery cells, and is provided with, as a supply voltage, a voltage of a positive electrode terminal of a battery cell disposed on the highest potential side of the measured battery cells. For this reason, when the voltages of battery cells are to be measured separately, a circuit that forms a measuring part needs to be formed of a high breakdown voltage element having a breakdown voltage higher than a voltage outputted by one battery cell. Since the high breakdown voltage element generally has a large size, there has been a problem that a voltage detecting circuit formed by using many high breakdown voltage elements has a large chip size.

In order to form the measuring part by use of a low breakdown voltage element, a "flying capacitor" method has been proposed as a measurement method for a voltage detecting circuit. In the flying capacitor method, a voltage outputted from one battery cell is sampled by a sampling capacitor, and the sampled voltage value is measured by the measuring part such as an analog-to-digital converter (A/D). Since this limits a voltage value inputted into the measuring part to a voltage range outputted from one battery cell, the measuring part can be formed of the low breakdown voltage element.

On the other hand, in order to efficiently use the lithium ion battery, it is necessary to measure a voltage value outputted by a battery cell with high accuracy. In the flying capacitor method, a large number of switches are used, and these switches have parasitic capacitance. For this reason, measurement by the flying capacitor method has a problem that the voltage value sampled by the sampling capacitor fluctuates due to this parasitic capacitance. Thus, the accuracy of measurement deteriorates. JP-A-2001-201522 has disclosed a technique that improves accuracy of measurement by the voltage detecting circuit in the flying capacitor method.

A circuit diagram of a cell voltage detecting circuit 100 disclosed in JP-A-2001-201522 is shown in FIG. 6. The cell voltage detecting circuit 100 separately measures voltage values of respective cells #(1) to #(N), which form a cell group 101, by measurement using the flying capacitor method. As shown in FIG. 6, the cell voltage detecting circuit 100 has cell selection switches 102 and 103, a sampling switch 104, a sampling capacitor 105, a transfer switch 106, and an A/D 107. Moreover, parasitic capacitance Cs is added to each switch shown in FIG. 6.

The cell selection switch 102 has switches SL(1) to SL(N) connected to negative electrode terminals of the cells #(1) to #(N), respectively. The cell selection switch 103 has switches SU(1) to SU(N) connected to positive electrode terminals of the cells #(1) to #(N), respectively. Here, the cell selection switch selects a single cell or multiple cells within the cell group 101.

The sampling switch 104 has a switch Spl-U provided corresponding to the positive electrode terminals of the cells (or a high potential side terminal of the sampling capacitor 105) and a switch Spl-L provided corresponding to the negative electrode terminals of the cells (or a low potential side terminal of the sampling capacitor 105). Here, the sampling switch 104 provides terminals on both sides of the sampling capacitor 105 with a potential difference between the negative electrode terminal and the positive electrode terminal of the cell selected by the cell selection switch. The sampling capacitor 105 is charged with a voltage sampled by the sampling switch 104.

The transfer switch 106 has a switch Trns-U provided corresponding to the positive electrode terminals of the cells (or the high potential side terminal of the sampling capacitor 105) and a switch Trns-L provided corresponding to the negative electrode terminals of the cells (or the low potential side terminal of the sampling capacitor 105). Here, after the sampling switch 104 changes to OFF, the transfer switch 106 transfers the voltages in both ends of the sampling capacitor 105 to output terminals of the transfer switch 106. The A/D 107 converts the potential difference transferred to the output terminals of the transfer switch 106 to a digital value, and outputs the digital value.

In other words, in the cell voltage detecting circuit 100, after the sampling capacitor 105 samples the voltage value of the cell, the sampling switch 104 is turned off to prevent the parasitic capacitance Cs of the cell selection switch from influencing subsequent measurement. This reduces a measurement error caused by the parasitic capacitance Cs of the cell selection switch in the cell voltage detecting circuit 100.

SUMMARY

However, the present inventor has recognized the following point. Namely, the cell voltage detecting circuit 100 has a problem that a measurement error caused by the parasitic capacitance Cs of the sampling switch 104 and the parasitic capacitance Cs of the transfer switch 106 cannot be reduced.

More specifically, in the cell voltage detecting circuit 100, charge in accordance with the potential difference between a grounding terminal and the positive electrode terminal of the selected cell is accumulated in the parasitic capacitance Cs of the sampling switch 104 and the parasitic capacitance Cs of the transfer switch 106. For that reason, the transfer switch 100 is turned on after the sampling switch 104 is turned off. However, during this period the parasitic capacitance Cs of the sampling switch 104 and that of the transfer switch 106 are continuously connected to the sampling capacitor 105. As a result, this parasitic capacitance Cs affects the measurement result.

Especially, when the number of the battery cells measured by one voltage detecting circuit increases, a larger amount of charge is accumulated in the parasitic capacitance Cs of the sampling switch 104 and the parasitic capacitance Cs of the transfer switch 106. Therefore, the problem of the measurement error caused by the parasitic capacitance Cs is more remarkable.

The present invention seeks to solve one or more of the above problems, or to improve upon those problems at least in part.

In one exemplary embodiment, a voltage detecting circuit includes a switch group that selects any one of a plurality of battery cells connected in series, a sampling capacitor that maintains a potential difference between a positive electrode terminal and a negative electrode terminal of a battery cell selected by the switch group, a measuring part that outputs a detected voltage value signal corresponding to the potential difference between ends of the sampling capacitor, a transfer switch that transfers, to the measuring part, the potential difference caused between the ends of the sampling capacitor, a correction capacitor provided in parallel to input terminals of the measuring part, and between the transfer switch and the measuring part, and a discharge switch provided in parallel to the correction capacitor, and controlled so that a switching condition of the discharge switch is mutually exclusive with that of the transfer switch.

The voltage detecting circuit according to the present invention can improve measurement accuracy of a voltage value of a battery cell.

BRIEF DESCRIPTION OF THE DRAWINGS

The above and other purposes, advantages and features of the present invention will become more apparent from the following description of certain exemplary embodiments taken in conjunction with the accompanying drawings in which.

DETAILED DESCRIPTION OF THE EXEMPLARY EMBODIMENTS

The invention will now be described herein with reference to illustrative exemplary embodiments. Those skilled in the art will recognize that many alternative embodiments can be accomplished using the knowledge of the present invention, and that the invention is not limited to the exemplary embodiments illustrated for explanatory purposes.

First Exemplary Embodiment

Figure 1:
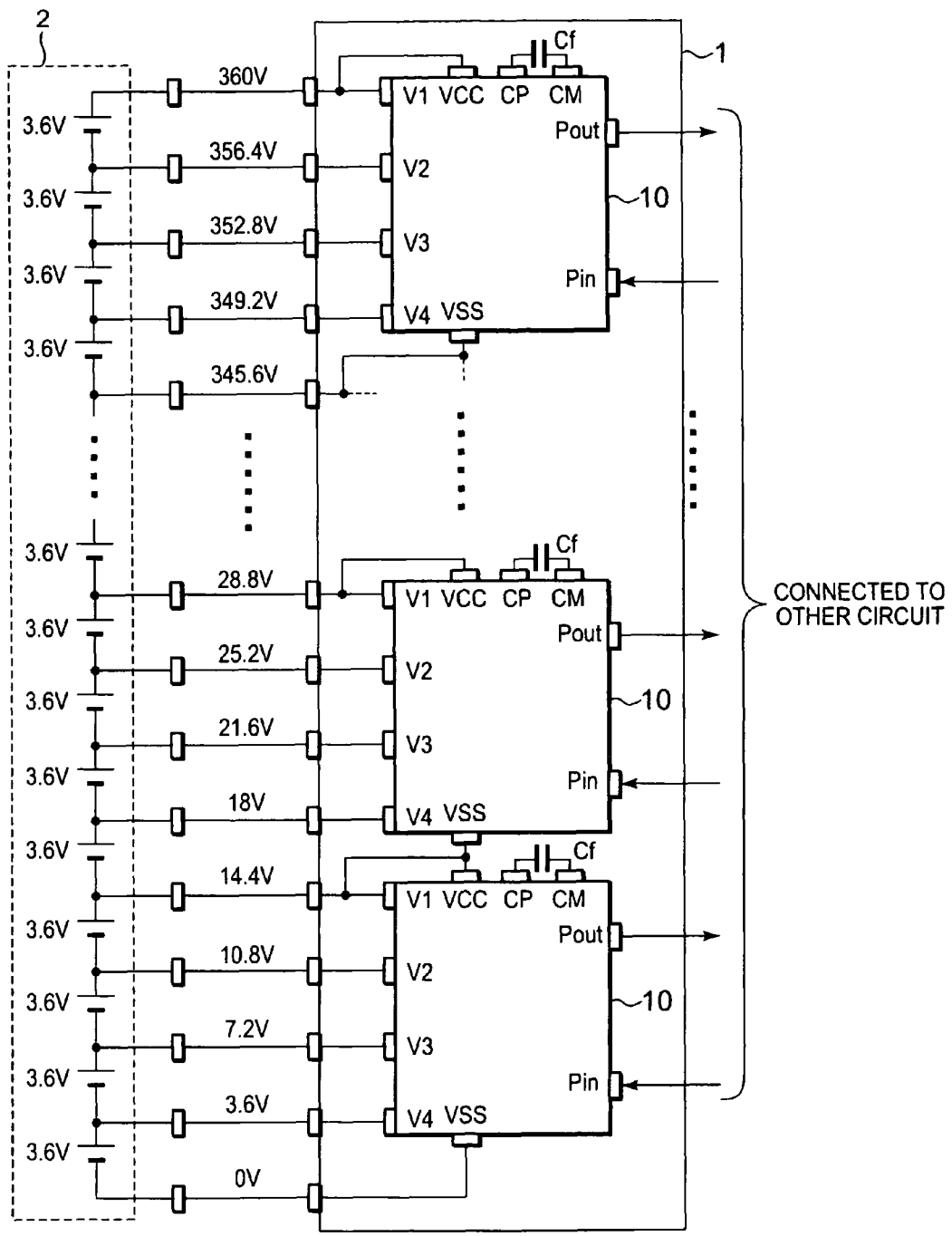
FIG. 1 is a block diagram of a power supply monitoring device 1 according to a first exemplary embodiment.

Hereinafter, a first exemplary embodiment of the invention will be described with reference to the drawings. FIG. 1 shows a block diagram of a power supply monitoring device 1 according to the first exemplary embodiment. As shown in FIG. 1, the power supply monitoring device 1 is connected to a battery pack 2 by connectors, and separately monitors voltage values of respective multiple battery cells. In the first exemplary embodiment, the battery pack 2 is 100 battery cells connected in series, each battery cell outputting a voltage of 3.6 V.

The power supply monitoring device 1 has multiple voltage detecting circuits 10. In the first exemplary embodiment, one voltage detecting circuit 10 detects voltages of respective four battery cells. Accordingly, the power supply monitoring device 1 has 25 voltage detecting circuits 10 in order to monitor the 100 battery cells. The number of the battery cells whose voltages are detected by one voltage detecting circuit 10 can be determined according to the specification of the power supply monitoring device 1.

Moreover, a power supply terminal VCC of the voltage detecting circuit 10 is connected to a positive electrode terminal of a battery cell with the highest potential among the battery cells measured by the voltage detecting circuit 10, and a grounding terminal VSS is connected to a negative electrode terminal of a battery cell with the lowest potential among the battery cells measured by the voltage detecting circuit. The battery cell whose negative electrode terminal is connected to the grounding terminal VSS is connected to a positive electrode terminal of a lower adjacent battery cell. In other words, in two voltage detecting circuits 10 that detect the voltages of adjacent battery cells, the grounding terminal VSS of the voltage detecting circuit 10 that detects the voltage of the battery cell on the higher potential side and the power supply terminal VCC of the voltage detecting circuit 10 that detects the voltage of the battery cell on the lower potential side, are connected in common.

The voltage detecting circuit 10 according to the first exemplary embodiment detects the voltages of the battery cells with the flying capacitor method. Here, since the voltage detecting circuit 10 according to the first exemplary embodiment uses a capacitor of a large capacity value as a sampling capacitor, the sampling capacitor Cf is an external component. The sampling capacitor Cf is connected between a first external terminal CP and a second external terminal CM.

Figure 2:
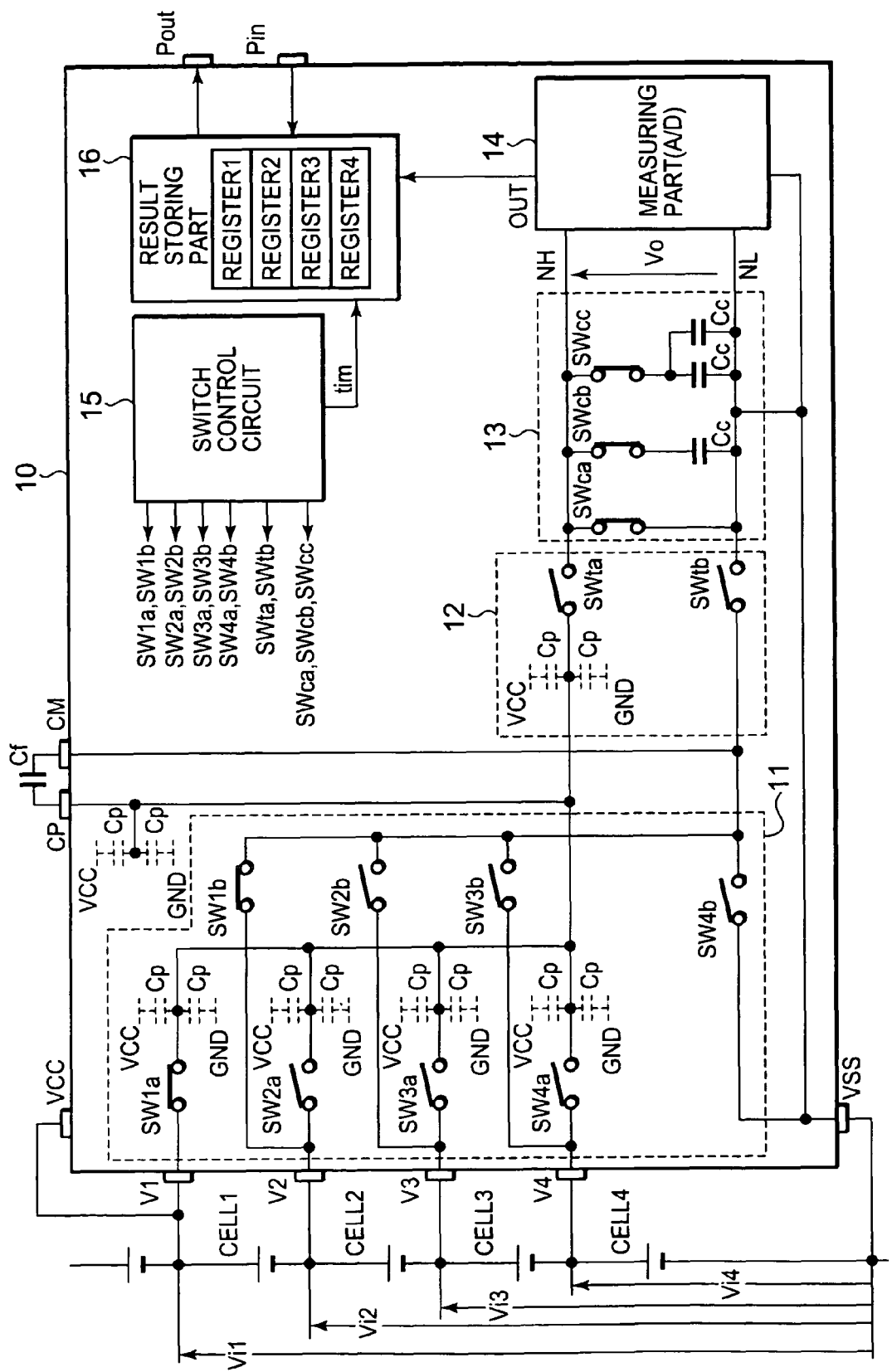
FIG. 2 is a circuit diagram of a voltage detecting circuit 10 according to the first exemplary embodiment.

Next, detailed description will be given on the voltage detecting circuit 10 according to the first exemplary embodiment. Since all of the voltage detecting circuits 10 mounted on the power supply monitoring device 1 have the same configuration, one voltage detecting circuit 10 will be described here. FIG. 2 shows a circuit diagram of the voltage detecting circuit 10. As shown in FIG. 2, the voltage detecting circuit 10 has a switch group 11, a transfer switch 12, a correction circuit 13, a measuring part 14, a switch control circuit 15, a result storing part 16, and the sampling capacitor Cf. The voltage detecting circuit 10 also has connection terminals V1 to V4 for connection with respective one of the battery cells, the power supply terminal VCC, the grounding terminal VSS, the first external terminal CP, the second external terminal CM, and communication terminals Pout and Pin.

The switch group 11 has selection switches SW1a to SW4a and SW1b to SW4b. One terminal of the selection switch SW1a is connected to a positive electrode terminal of a cell 1, which is the battery cell with the highest potential among the battery cells measured. One terminal of the selection switch SW2a is connected to a positive electrode terminal of a cell 2 whose positive electrode terminal is connected to a negative electrode terminal of the cell 1. One terminal of the selection switch SW3a is connected to a positive electrode terminal of a cell 3 whose positive electrode terminal is connected to a negative electrode terminal of the cell 2. One terminal of the selection switch SW4a is connected to a positive electrode terminal of a cell 4, which is the battery cell with the lowest potential among the battery cells measured. The other terminals of the respective selection switches SW1a to SW 4a are connected to one terminal of the sampling capacitor Cf through the first external terminal CP.

One terminal of the selection switch SW1b is connected to the negative electrode terminal of the cell 1, which is the battery cell with the highest potential among the battery cells measured. One terminal of the selection switch SW2b is connected to the negative electrode terminal of the cell 2 whose positive electrode terminal is connected to the negative electrode terminal of the cell 1. One terminal of the selection switch SW3b is connected to the negative electrode terminal of the cell 3 whose positive electrode terminal is connected to the negative electrode terminal of the cell 2. One terminal of the selection switch SW4b is connected to the negative electrode terminal of the cell 4, which is the battery cell with the lowest potential among the battery cells measured. The other terminals of the respective selection switches SW1b to SW4b are connected to the other terminal of the sampling capacitor Cf through the second external terminal CM.

In the first exemplary embodiment, the selection switches connected to one battery cell are turned on or turned off at the same time. In the first exemplary embodiment, a group of the switch that the switch group 11 selects is one. For example, when the cell 1 is selected, the selection switches SW1a and SW1b are turned on, and the selection switches SW2a to SW4a and the selection switches SW2b to SW4b are turned off.

The transfer switch 12 has a high potential side transfer switch SWta and a low potential side transfer switch SWtb. One terminal of the high potential side transfer switch SWta is connected to the one terminal of the sampling capacitor Cf through the first external terminal CP, and the other terminal of the high potential side transfer switch SWta is connected to a high potential side input terminal of the measuring part 14. One terminal of the low potential side transfer switch SWtb is connected to the other terminal of the sampling capacitor Cf through the second external terminal CM, and the other terminal of the low potential side transfer switch SWtb is connected to a low potential side input terminal of the measuring part 14. In the first exemplary embodiment, ON/OFF control of the high potential side transfer switch SWta and the low potential side transfer switch SWtb are performed together.

The correction circuit 13 has a discharge switch SWca, a capacity value change switch SWcb, SWcc, and correction capacitors Cc. In the description below, a node that connects the high potential side transfer switch SWta and the high potential side input terminal of the measuring part 14 is referred to as a high potential node NH. A node that connects the low potential side transfer switch SWtb and the low potential side input terminal of the measuring part 14 is referred to as a low potential node NL. The low potential node NL is also connected to the grounding terminal VSS.

The correction capacitor Cc absorbs excessive charge accumulated in parasitic capacitance added to a measurement voltage transfer path of the voltage detecting circuit 10 at the time when the transfer switches SWta and SWtb switch to an ON state. The correction capacitors Cc are provided between the high potential node NH and the low potential node NL. In other words, the correction capacitors Cc are connected in parallel to each other between the high potential side input terminal and the low potential side input terminal of the measuring part 14. Three correction capacitors Cc are provided in the first exemplary embodiment. In addition, one of the three correction capacitors Cc is connected to the high potential node NH through the capacity value change switch SWcb. Other two of the three correction capacitors Cc are connected to the high potential node NH through the capacity value change switch SWcc. In the first exemplary embodiment, all the correction capacitors Cc have the same capacity value. Moreover, the capacity value of the correction capacitor Cc is determined in accordance with a capacity value of parasitic capacitance Cp added to the selection switch, the transfer switch, and the first and second external terminals. Detailed description on the capacity value of this correction capacitor Cc will be given later.

The discharge switch SWca is a switch that switches whether to short-circuit both ends of the correction capacitors Cc. In the first exemplary embodiment, the discharge switch SWca is provided between the high potential node NH and the low potential node NL. The discharge switch SWca in the first exemplary embodiment discharges, to the grounding terminal VSS, the charge accumulated in the correction capacitors Cc, which are connected to the switch that is ON among the capacity value change switches SWcb and SWcc. The discharge switch SWca is controlled mutually exclusively with the transfer switches SWta and SWtb. In other words, the discharge switch SWca is off for a period for which the transfer switches SWta and SWtb are turned on, and the discharge switch SWca is on for a period for which the transfer switches SWta and SWtb are turned off.

The measuring part 14 measures the potential difference between the high potential node NH and the low potential node NL, i.e., the voltage of the battery cell that is sampled by the sampling capacitor Cf and that is to be measured, and outputs the detection voltage value signal OUT. Although the voltage value measured is an analog value in the first exemplary embodiment, an analog-to-digital converter (A/D) may be used as the measuring part 14 to output the detection voltage value signal OUT shown in a digital value.

The switch control circuit 15 controls switching conditions of the selection switches SW1a to SW4a, SW1b to SW4b, the transfer switches SWta and SWtb, the discharge switch SWca, the capacity value change switches SWcb, and SWcc, respectively. The switch control circuit 15 also automatically starts operating after power of the voltage detecting circuit 10 is switched on, and controls the switch to be controlled so that the measurement of the cell 1 to cell 4 is sequentially performed. Moreover, the switch control circuit 15 outputs a timing notification signal tim. The timing notification signal tim gives information for identifying a cell being measured at present to an other circuit (in the first exemplary embodiment, the result storing part 16). The switch control circuit 15 may have a specification in which the switch control circuit 15 operates in response to a control signal from the outside. For example, the switch control circuit 15 may receive an instruction to measure a particular cell as a control signal from the outside, switch the switch in response to the control signal, and measure an instructed cell.

The result storing part 16 includes multiple registers (in the first exemplary embodiment, the registers 1 to 4), and stores a measurement result for each battery cell in the register. Here, on the basis of the timing notification signal tim, the result storing part 16 determines in which register the result is stored. The result storing part 16 is externally connected by communication terminals Pout and Pin. A read command from another circuit is inputted from the communication terminal Pin. Moreover, the communication terminal Pout outputs a value stored in the result storing part 16. In other words, the result storing part 16 outputs the measurement result of the battery cell stored in the register in response to the read command from another circuit.

Here, detailed description will be given on the correction capacitor Cc. First, in the first exemplary embodiment, the parasitic capacitance Cp is added to each of a drain terminal of the selection switches SW1a to SW4a disposed on the measurement voltage measurement path, the first external terminal CP, and a drain terminal of the high potential side transfer switch SWta, respectively (see FIG. 2). This parasitic capacitance Cp is formed in each of the grounding terminal VSS side and the power supply terminal VCC side. The parasitic capacitance Cp added to a drain terminal of the selection switches SW1a to SW4a and the parasitic capacitance Cp added to the drain side of the transfer switch each are parasitic capacitance added to a drain terminal of the transistor that forms the switch. The parasitic capacitance Cp added to the first external terminal CP includes, for example, a terminal capacity of a package that stores the voltage detecting circuit 10, a junction capacity of an electrostatic breakdown protection circuit (or protective diode) provided in the terminal of the voltage detecting circuit 10, a pad capacity, and the like.

Thus, in the voltage detecting circuit 10, a large number of parasitic capacitances are added in the measurement voltage transfer path that transfers the voltage of the battery cell to be measured to the measuring part 14. Here, the correction capacitor Cc according to the first exemplary embodiment has a value in accordance with a total of the capacity values of the above-mentioned parasitic capacitances. Hereinafter, a method for determining the capacity value of the correction capacitor Cc will be described in detail.

First, a measurement voltage Vo (voltage of the battery cell) generated between the high potential node NH and the low potential node NL when no correction capacitor Cc is provided is shown by a formula (1). The formula (1) is a formula used when measuring the cell 1. In the formula (1), Vi1 is the value that represents the potential difference between the voltage of the positive electrode terminal of the cell 1 and that of the grounding terminal VSS. Vi2 is the value that represents the potential difference between the voltage of the negative electrode terminal of the cell 1 and that of the grounding terminal VSS. Moreover, ΣCp represents a total of the capacity values of the parasitic capacitances Cp, and Cf represents the capacity value of the sampling capacitor Cf.

$$Vo=(Vi1-Vi2)+(1/(1+Cf/\Sigma Cp))*Vi2 \quad (1)$$

In the formula (1), the first term is an ideal value of the voltage value of the battery cell to be measured, and the second term shows a measurement error.

Next, the measurement voltage Vo when providing the correction capacitor is shown in a formula (2). In the formula (2), N is a value that represents the number of the correction capacitors Cc connected to the high potential node NH. Cc represents the capacity value of the correction capacitor Cc.

$$Vo=(Vi1-Vi2)+((\Sigma Cp+N*Cc)*Vi2-N*Cc*Vi1)/(Cf+\Sigma Cp*N*Cc) \quad (2)$$

Also in the formula (2), the second term shows a measurement error. Accordingly, in order to make the measurement error zero, it is necessary to determine the value of the correction capacitor Cc and the number N of the correction capacitors Cc connected to the high potential node NH so that the second term may be zero. Accordingly, the number N of the correction capacitors Cc and the capacity value of the correction capacitor Cc can be represented by a formula (3).

$$N=(\Sigma Cp/Cc)*(Vi2/(Vi1-Vi2)) \quad (3)$$

Thus, in the first exemplary embodiment, the value of the correction capacitor Cc is defined as a total of the capacity values of the parasitic capacitances Cp. Accordingly, the capacity value of the correction capacitor Cc in the first exemplary embodiment is represented by a formula (4).

$$Cc=\Sigma Cp \quad (4)$$

A magnitude of the parasitic capacitance Cp or the total ΣCp of the parasitic capacitances can be obtained by various methods, such as simulation in a design stage, calculation by measurement in a shipping test of products, and the like. When obtaining the parasitic capacitance by measurement, it is preferable to adopt a circuit configuration in which the capacity value of one correction capacitor Cc can be changed by correcting means such as trimming is provided.

Then, when the formula (4) is substituted for the formula (3), the number N of the correction capacitor Cc is represented by a formula (5).

$$N=(Vi2/(Vi1-Vi2)) \quad (5)$$

Here, in a normal operating state, the voltages of the battery cells are controlled uniformly, and it is thought that there is no large fluctuation in a voltage difference between the battery cells. Accordingly, from the formula (5), the number N of the correction capacitors Cc connected to the high potential node NH when measuring the cell 1 is 3. In the similar manner, N is 2 when measuring the cell 2, and N is 1 when measuring the cell 3.

N when measuring the cell 4 is zero. This is because an error attributed to the measurement using the flying capacitor method does not occur when measuring the cell 4. More specifically, when the cell 4 is measured, fluctuation does not occur between the time of sampling the voltage of the cell 4 to the sampling capacitor Cf and the time of subsequent measurement in the voltages of both ends of the sampling capacitor Cf. Accordingly, at the time of measurement of the cell 4, no excessive charge is accumulated in the parasitic capacitance Cp, and no measurement error attributed to the parasitic capacitance Cp is generated.

Figure 3:
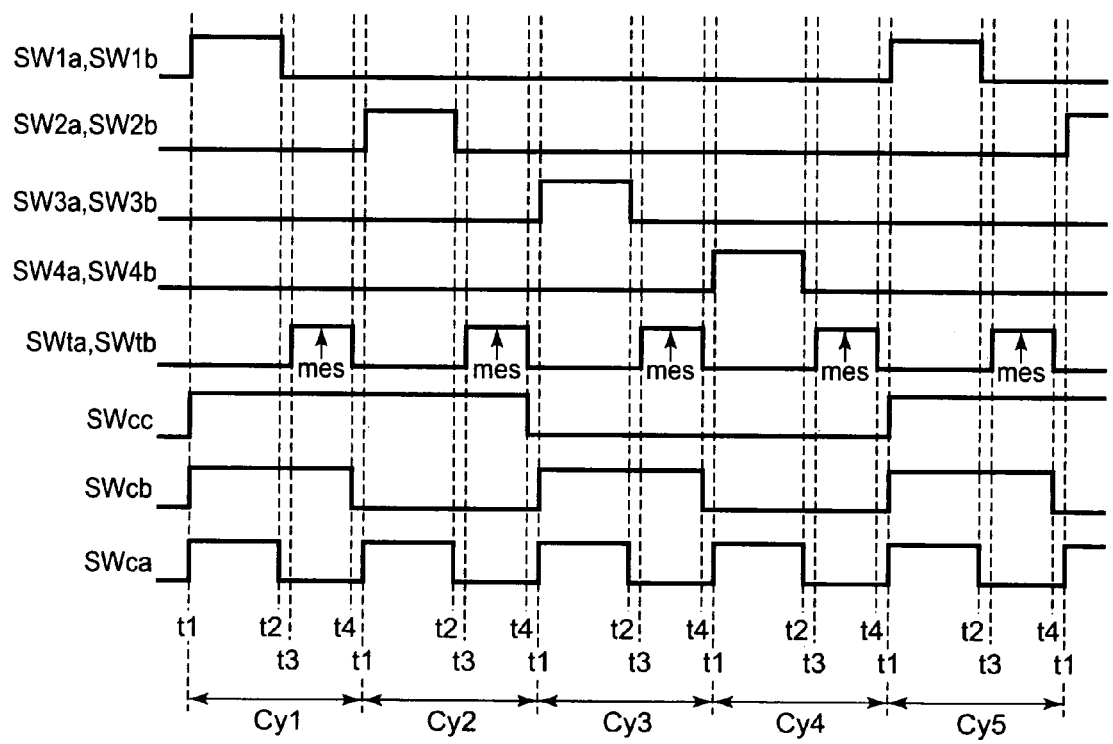
FIG. 3 is a timing chart that shows operation of the voltage detecting circuit 10 according to the first exemplary embodiment.

Subsequently, operation of the voltage detecting circuit 10 will be described. FIG. 3 shows a timing chart of the operation of the voltage detecting circuit 10. As shown in FIG. 3, the voltage detecting circuit 10 measures the battery cells to be measured one by one in order of the cell 1 to the cell 4. Then, when measurement of the cell 4 finishes, measurement is started again from the cell 1. Here, in the description below, a period for which one battery cell is measured is referred to as a "cycle", and five cycles (Cy1 to Cy5) are shown in FIG. 3. While an example in FIG. 3 shows a control signal for each switch, the switch is turned off when the control signal is at a low level, and the switch is turned on when the control signal is at a high level.

In the example shown in FIG. 3, the selection switches SW1a and SW1b are turned on, and other selection switches are turned off at timing t1 of the cycle Cy1. Thereby, the potential difference between the positive electrode terminal and the negative electrode terminal of the cell 1 is sampled by the sampling capacitor Cf. Moreover, at timing t1, the high potential side transfer switch SWta and the low potential side transfer switch SWtb are turned off, the discharge switch SWca is turned on, and the capacity value change switches SWcb and SWcc are turned on. Thereby, in the correction circuit 13, the three correction capacitors Cc are connected to the high potential node NH. Moreover, since the discharge switch is turned on, the charge previously accumulated in the three correction capacitor Cc connected to the high potential node NH is discharged to the grounding terminal VSS.

Subsequently, at timing t2, the selection switches SW1a and SW1b are turned off, and all the selection switches are brought into the OFF state. The discharge switch SWca is also turned off. Next, at timing t3, the high potential side transfer switch SWta and the low potential side transfer switch SWtb are turned on. Thereby, the one terminal of the sampling capacitor Cf which is connected to the first external terminal CP is connected to the high potential node NH, and the other terminal of the sampling capacitor Cf which is connected to the second external terminal CM is connected to the low potential node NL. In other words, the other terminal of the sampling capacitor Cf has the ground voltage, and the voltage of the cell 1 maintained between both ends of the sampling capacitor Cf is transferred to the high potential node NH. Moreover, at this time, the charge corresponding to the potential difference between the potential of the negative electrode terminal of the cell 4 and the potential of the positive electrode terminal of the cell 2 is accumulated in the parasitic capacitance Cp as excessive charge. This excessive charge is absorbed by the correction capacitor Cc when the transfer switch 12 conducts. Thereby, the second term of the measurement voltage Vo shown in the above-mentioned formula (2) becomes approximately zero, and the measurement error is almost eliminated. Subsequently, the measuring part 14 measures a measurement voltage Vo at a measurement timing mes, and outputs a detected voltage value signal OUT. Moreover, on the basis of the detected voltage value signal OUT, the voltage value of the cell 1 is stored in the register 1. Since the operation of the cycle Cy5 is the same as that of the cycle Cy1, description thereof will be omitted.

The cycle Cy2 to the cycle Cy4 are periods corresponding to measurement of the cell 2 to the cell 4, respectively. Since substantial operation is the same as that of the cycle Cy1 in the operation of the cycle Cy2 to the cycle Cy4, hereinafter, description will be given only to portions largely different from cycle Cy1.

In the cycle Cy2, the selection switches SW2a and SW2b are turned on from timing t1 to timing t2. Moreover, the capacity value change switch SWcb is turned off, and the capacity value change switch SWcc is turned on. In other words, two correction capacitors Cc are connected to the high potential node NH in the cycle Cy2. Then, in the cycle Cy2, the charge of two correction capacitors Cc is discharged during the period between timing t1 and timing t2. Then, during the measurement period between timing t3 and timing t4, the voltage of the cell 2 from which an error component is removed by operation of the correction circuit 13 is measured.

In the cycle Cy3, the selection switches SW3a and SW3b are turned on from timing t1 to timing t2. Moreover, the capacity value change switch SWcb is turned on, and the capacity value change switch SWcc is turned off. In other words, one correction capacitor Cc is connected to the high potential node NH in the cycle Cy3. Then, in the cycle Cy3, the charge of one correction capacitor Cc is discharged from timing t1 to timing t2. Then, during the measurement period between timing t3 and timing t4, the voltage of the cell 3 from which an error component is removed by the operation of the correction circuit 13 is measured.

In the cycle Cy4, the selection switches SW4a and SW4b are turned on from timing t1 to timing t2. Moreover, both of the capacity value change switches SWcb and SWcc are turned off. In other words, no correction capacitor Cc is connected to the high potential node NH in the cycle Cy4. For that reason, in the cycle Cy4, even when the discharge switch SWca is turned on during the period between timing t1 and timing t2, the charge is not discharged from the correction capacitor Cc. Then, the voltage of the cell 4 is measured during the measurement period between timing t3 and timing t4. In this measurement of the cell 4, as described above, no measurement error is caused by the parasitic capacitance Cp.

As in the above-mentioned description, the voltage detecting circuit 10 according to the first exemplary embodiment discharges the charge accumulated in the correction capacitor Cc during the sampling period for which the voltage value of the battery cell is sampled. Then, the sampling capacitor Cf is connected to the high potential node NH and the low potential node NL, which are connected to the correction capacitor Cc whose maintained amount of charge has become zero. Thereby, the excessive charge accumulated in the parasitic capacitance Cp added to the measurement voltage transfer path, during the sampling period when the voltage detecting circuit 10 samples the voltage value of the battery cell, is absorbed by the correction capacitor Cc during the measurement period. In other words, an effect of this excessive charge on the measurement voltage Vo is reduced, since the correction capacitor Cc absorbs the excessive charge accumulated in the parasitic capacitance Cp. Accordingly, the voltage detecting circuit 10 can measure the voltage of the battery cell with high accuracy.

Particularly, the voltage detecting circuit 10 according to the first exemplary embodiment discharges the correction capacitor Cc by use of the discharge switch SWca, every time the battery cell to be measured is switched. Thereby, in the voltage detecting circuit 10, the charge absorbed in the correction capacitor Cc in the previous measurement cycle does not affect the measurement of the present measurement cycle. Accordingly, the voltage detecting circuit 10 can maintain high accuracy of measurement in any measurement cycle.

Moreover, in the voltage detecting circuit 10 according to the first exemplary embodiment, the capacity value of the correction capacitor Cc is defined as a total of the capacity values of the parasitic capacitances Cp. Thereby, the measurement error shown by the second term of the above-mentioned formula (2) can be brought close to zero as much as possible. In order to bring the measurement error close to zero as much as possible, as described in the above-mentioned first exemplary embodiment, preferably, the number of the correction capacitors Cc is switched depending on an order of a battery cell to be measured in the battery cell group to be measured. This is because the measurement error has a magnitude proportional to the potential difference between the potential of the negative electrode terminal of the battery cell to be measured and the grounding potential.

Second Exemplary Embodiment

Figure 4:
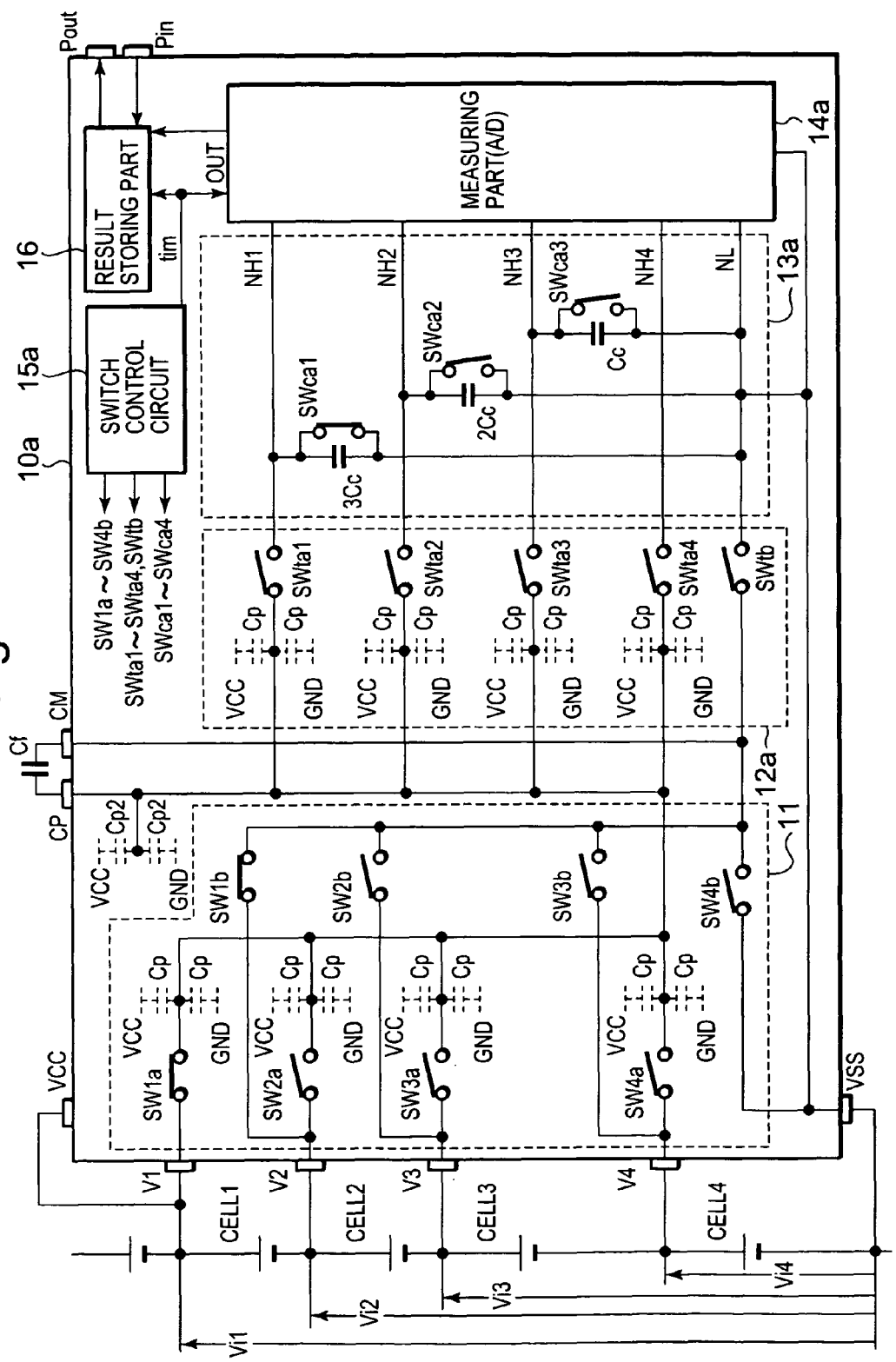
FIG. 4 is a circuit diagram of the voltage detecting circuit 10a according to a second exemplary embodiment.

According to a second exemplary embodiment, description will be given on a voltage detecting circuit 10a that is a modification of the voltage detecting circuit 10 described in the first exemplary embodiment. FIG. 4 shows a circuit diagram of the voltage detecting circuit 10a.

As shown in FIG. 4, the voltage detecting circuit 10a has the switch group 11, a transfer switch 12a, a correction circuit 13a, the measuring part 14, a switch control circuit 15a, the result storing part 16, and the sampling capacitor Cf. The voltage detecting circuit 10a has the connection terminals V1 to V4 for connection to the respective battery cells, the power supply terminal VCC, the grounding terminal VSS, the first external terminal CP, the second external terminal CM, and the communication terminals Pout and Pin. In the voltage detecting circuit 10a shown in FIG. 4, same reference numerals as those in the voltage detecting circuit 10 shown in FIG. 2 will be given to same components as those in the voltage detecting circuit 10, and description thereof will be omitted.

A transfer switch 12a has a low potential side transfer switch SWtb and high potential side transfer switches SWta1 to SWta4. One terminal of the low potential side transfer switch SWtb is connected to the other terminal of the sampling capacitor Cf through the second external terminal CM, and the other terminal of the low potential side transfer switch SWtb is connected to the low potential side input terminal of the measuring part 14. The high potential side transfer switches SWta1 to SWta4 are switches respectively corresponding to the cell 1 to the cell 4 to be measured. One terminal of each of the respective high potential side transfer switches SWta1 to SWta4 is connected to the respective one terminal of the sampling capacitor Cf through the first external terminal CP. The other terminal of each of the respective high potential side transfer switches SWta1 to SWta4 is connected to the respective high potential side input terminals of the measuring part 14. Moreover, in the transfer switch 12a, the high potential side transfer switch SWta1 is connected to the measuring part 14 through the high potential node NH1. The high potential side transfer switch SWta2 is connected to the measuring part 14 through the high potential node NH2. The high potential side transfer switch SWta3 is connected to the measuring part 14 through the high potential node NH3. The high potential side transfer switch SWta4 is connected to the measuring part 14 through the high potential node NH4. In the second exemplary embodiment, ON/OFF control of any one of the high potential side transfer switches SWta1 to SWta4 and the low potential side transfer switch SWtb are performed together.

The correction circuit 13a has the discharge switches SWca1 to SWca3 and the correction capacitors Cc. In the correction circuit 13a, the correction capacitors Cc are connected respectively between the high potential node NH1 and the low potential node NL, between the high potential node NH2 and the low potential node NL, and between the high potential node NH3 and the low potential node NL. When the unit capacitance is expressed by Cc, the correction capacitor connected between the high potential node NH1 and the low potential node NL has a capacity value of 3 Cc, which is three times the unit capacitance. The correction capacitor connected between the high potential node NH2 and the low potential node NL has the capacity value of 2 Cc, which is twice the unit capacitance. The correction capacitor connected between the high potential node NH3 and the low potential node NL has the capacity value of 1 Cc, which is one time of the unit capacitance.

The discharge switch SWca1 is connected parallel to the correction capacitor connected between the high potential node NH1 and the low potential node NL. The discharge switch SWca2 is connected parallel to the correction capacitor connected between the high potential node NH2 and the low potential node NL. The discharge switch SWca3 is connected parallel to the correction capacitor connected between the high potential node NH3 and the low potential node NL. Moreover, with respect to the switching condition, the discharge switches SWca1 to SWca3 are respectively controlled mutually exclusive with the high potential side transfer switches SWta1 to SWta3. Moreover, the unit capacitance of the correction capacitor Cc is obtained from the formula (1) to the formula (5) described in the first exemplary embodiment.

The measuring part 14a measures the potential difference between any one node of the high potential nodes NH1 to NH4 and the low potential node NL, i.e., the voltage of the battery cell to be measured which is sampled by the sampling capacitor Cf, and then outputs the detected voltage value signal OUT. At this time, the measuring part 14a selects the high potential node to be measured on the basis of the timing notification signal tim outputted from the switch control circuit 15a.

Although the switch control circuit 15a is substantially the same as the switch control circuit 15 in the first exemplary embodiment, depending on an increase of the switches in the transfer switch 12a, the number of the switches to be controlled is increased. Moreover, the switch control circuit 15a also outputs the timing notification signal tim to the measuring part 14a.

Figure 5:
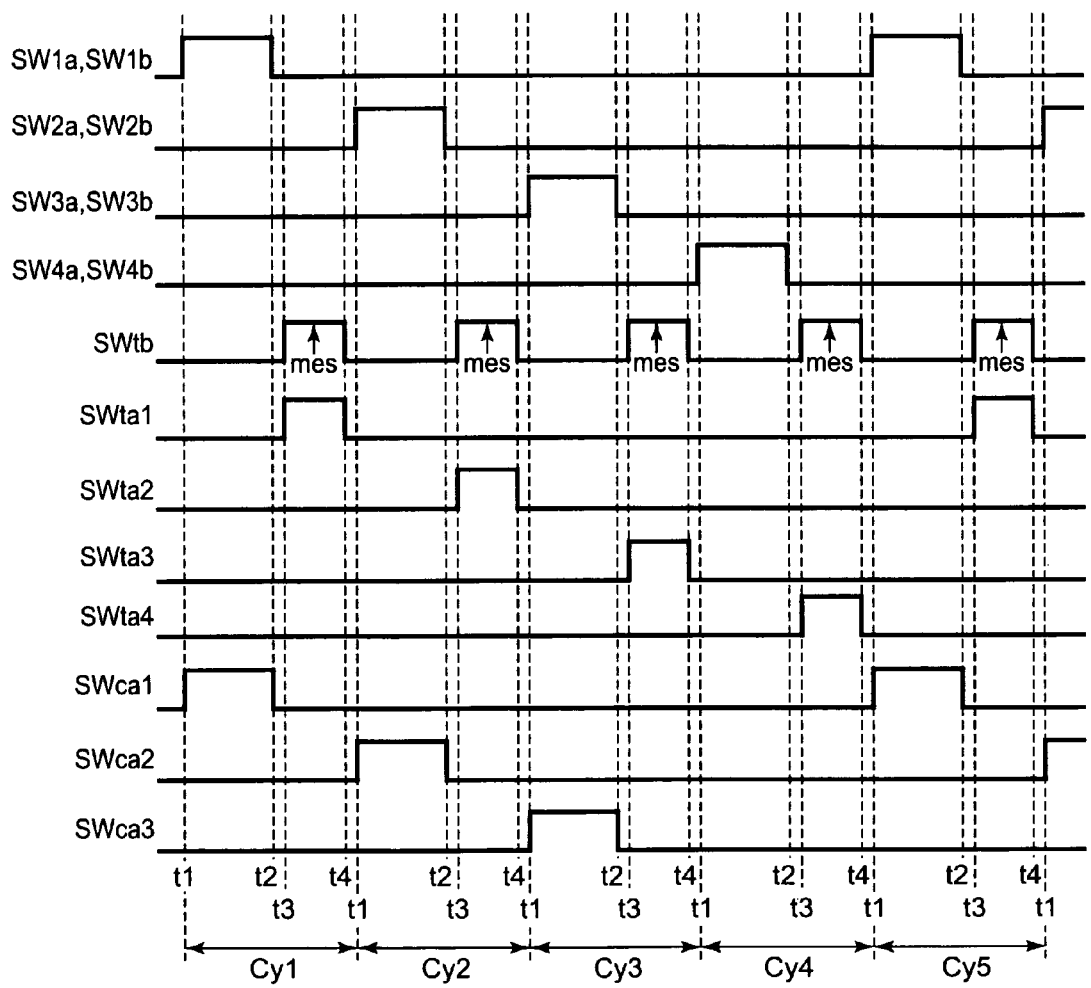
FIG. 5 is a timing chart that shows operation of the voltage detecting circuit 10a according to the second exemplary embodiment.
Figure 6:
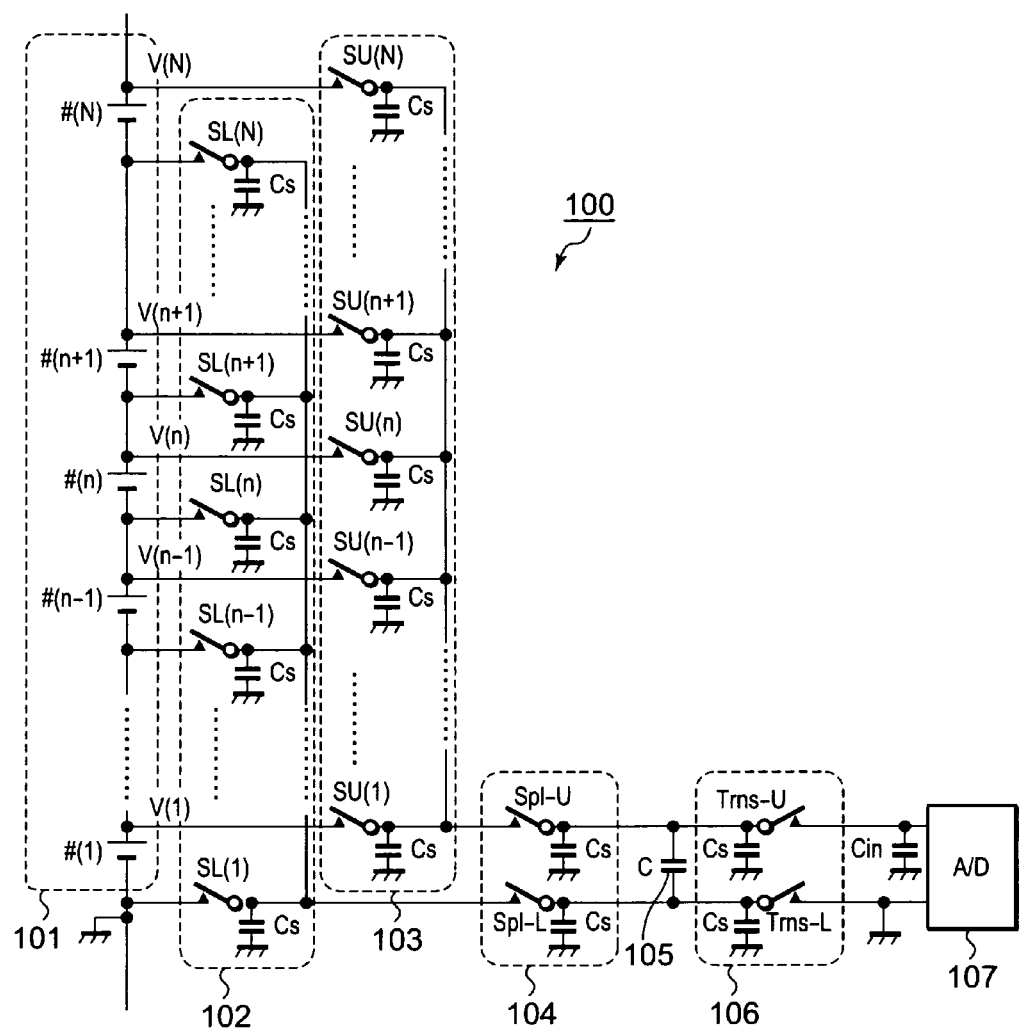
FIG. 6 is a circuit diagram of a voltage detecting circuit of a related art.

Next, operation of the voltage detecting circuit 10a will be described. FIG. 5 shows a timing chart of the operation of the voltage detecting circuit 10a. The timing chart shown in FIG. 5 corresponds to the operation of the voltage detecting circuit 10 shown in FIG. 3.

As shown in FIG. 5, the operation of the switch group 11 and the low potential side transfer switch SWtb of the voltage detecting circuit 10a is the same as that of the voltage detecting circuit 10. Therefore, hereinafter, operation of the voltage detecting circuit 10a different from that of the voltage detecting circuit 10 will be described in particular.

Since the cell 1 is selected in the cycle Cy1, the discharge switch SWca1 is turned on from timing t1 to timing t2 as shown in FIG. 5. Thereby, discharge from the correction capacitor Cc connected between the high potential node NH1 and the low potential node NL is performed. Then, the high potential side transfer switch SWta1 and the low potential side transfer switch SWtb are turned on from timing t3 to timing t4. Thereby, the potential difference between the high potential node NH1 and the low potential node NL becomes equal to a voltage of the cell 1 sampled by the sampling capacitor Cf. Moreover, from timing t3 to timing t4, excessive charge accumulated in the parasitic capacitance Cp is absorbed by the correction capacitor Cc. Then, the measuring part 14a measures the potential difference between the high potential node NH1 and the low potential node NL at the measurement timing mes, and outputs the detected voltage value signal OUT.

Since the cell 2 is selected in the cycle Cy2, the discharge switch SWca2 is turned on from timing t1 to t2. Thereby, discharge from the correction capacitor Cc connected between the high potential node NH2 and the low potential node NL is performed. Then, the high potential side transfer switch SWta2 and the low potential side transfer switch SWtb is turned on from timing t3 to timing t4. Thereby, the potential difference between the high potential node NH2 and the low potential node NL becomes equal to a voltage of the cell 2 sampled by the sampling capacitor Cf. Moreover, from timing t3 to timing t4, excessive charge accumulated in the parasitic capacitance Cp is absorbed by the correction capacitor Cc. Then, the measuring part 14a measures the potential difference between the high potential node NH2 and the low potential node NL at the measurement timing mes, and outputs the detected voltage value signal OUT.

Since the cell 3 is selected in the cycle Cy3, the discharge switch SWca3 is turned on from timing t1 to t2. Thereby, discharge from the correction capacitor Cc connected between the high potential node NH3 and the low potential node NL is performed. Then, the high potential side transfer switch SWta3 and the low potential side transfer switch SWtb are turned on from timing t3 to timing t4. Thereby, the potential difference between the high potential node NH3 and the low potential node NL becomes equal to a voltage of the cell 3 sampled by the sampling capacitor Cf. Moreover, at the timing t3 to t4, excessive charge accumulated in the parasitic capacitance Cp is absorbed by the correction capacitor Cc. Then, the measuring part 14a measures the potential difference of the high potential node NH3 and the low potential node NL at the measurement timing mes, and outputs the detected voltage value signal OUT.

The cell 4 is selected in the cycle Cy4. Here, since no discharge switch is provided in the high potential node NH4, there is no discharge switch that is turned on from timing t1 to timing t2. Then, the high potential side transfer switch SWta4 and the low potential side transfer switch SWtb are turned on from timing t3 to timing t4. Thereby, the potential difference between the high potential node NH4 and the low potential node NL becomes equal to a voltage of the cell 4 sampled by the sampling capacitor Cf. The measuring part 14a measures the potential difference between the high potential node NH4 and the low potential node NL at the measurement timing mes, and outputs the detected voltage value signal OUT.

As in the above-mentioned description, the voltage detecting circuit 10a shows a modification of the voltage detecting circuit 10, and the operation in which the correction capacitor Cc absorbs the excessive charge accumulated in the parasitic capacitance Cp at the time of measurement of the voltage of the battery cell by the measuring part 14a is performed similarly to the case of the voltage detecting circuit 10. Accordingly, also in the voltage detecting circuit 10a according to the second exemplary embodiment, improvement in accuracy of measurement can be achieved in the same manner as in the case of the voltage detecting circuit 10 according to the first exemplary embodiment.

Furthermore, a measurement sequence by the switch control circuit can be changed properly depending on a specification of a product. It is also possible to properly change a method for storing and outputting a measurement result depending on a specification of a product.

Although the invention has been described above in connection with several exemplary embodiments thereof, it will be appreciated by those skilled in the art that those exemplary embodiments is provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:

1. A voltage detecting circuit, comprising:
   a switch group that selects any one of a plurality of battery cells connected in series;
   a sampling capacitor that maintains a potential difference between a positive electrode terminal and a negative electrode terminal of a battery cell selected by the switch group;
   a measuring part that outputs a detected voltage value signal corresponding to a potential difference between ends of the sampling capacitor;
   a transfer switch that transfers, to the measuring part, the potential difference between the ends of the sampling capacitor;
   a correction capacitor provided in parallel to input terminals of the measuring part, and between the transfer switch and the measuring part; and
   a discharge switch provided in parallel to the correction capacitor, and controlled so that a switching condition of the discharge switch is mutually exclusive with that of the transfer switch,
   wherein, in the correction capacitor, a capacity value is switchable to a larger value in a case of a measurement of a battery cell connected to a high potential side of the plurality of battery cells, and
   wherein the capacity value of the correction capacitor is determined in accordance with a potential difference between a potential of a positive electrode terminal of a battery cell corresponding to a high potential side transfer switch, and a potential of a negative electrode terminal of a battery cell connected to a lowest potential side, the positive electrode terminal being connected to the correction capacitor.

2. The voltage detecting circuit according to claim 1, wherein the capacity value of the correction capacitor corresponds to a capacity value of a parasitic capacitance added to the transfer switch.

3. The voltage detecting circuit according to claim 1, wherein the correction capacitor is disconnected from the transfer switch and the measuring part in a case of a measurement of the battery cell connected to the lowest potential side of the plurality of battery cells.

4. The voltage detecting circuit according to claim 1, wherein the sampling capacitor comprises a capacitor externally added to the voltage detecting circuit, and
   wherein the voltage detecting circuit further comprises:
      first and second external terminals to which the sampling capacitor is connected.

5. The voltage detecting circuit according to claim 4, wherein the correction capacitor has the capacity value corresponding to a capacity value of a parasitic capacitance added to the transfer switch and the first and second external terminals.

6. The voltage detecting circuit according to claim 1, further comprising:
   a switch control circuit that controls a switching condition of each switching circuit included in the switch group and that of the transfer switch.

7. The voltage detecting circuit according to claim 1, wherein the transfer switch includes:
   a low potential side transfer switch that connects a low potential side terminal of the sampling capacitor to a low potential side input terminal of the measuring part; and
   the high potential side transfer switch that connects a high potential side terminal of the sampling capacitor to a high potential side input terminal of the measuring part.

8. A voltage detecting circuit, comprising:
   a switch group that selects any one of a plurality of battery cells connected in series;
   a sampling capacitor that maintains a potential difference between a positive electrode terminal and a negative electrode terminal of a battery cell selected by the switch group;
   a measuring part that outputs a detected voltage value signal corresponding to a potential difference between ends of the sampling capacitor;
   a transfer switch that transfers, to the measuring part, the potential difference between the ends of the sampling capacitor;
   a correction capacitor provided in parallel to input terminals of the measuring part, and between the transfer switch and the measuring part; and a discharge switch provided in parallel to the correction capacitor, and controlled so that a switching condition of the discharge switch is mutually exclusive with that of the transfer switch, wherein the transfer switch includes:

a low potential side transfer switch that connects a low potential side terminal of the sampling capacitor to a low potential side input terminal of the measuring part; and a plurality of high potential side transfer switches that each connects a high potential side terminal of the sampling capacitor to a high potential side input terminal of the measuring part, a number of the high potential side transfer switches corresponding to a number of the plurality of battery cells, and wherein the correction capacitor and the discharge switch are connected to said each of the plurality of high potential side transfer switches except for a high potential side transfer switch corresponding to a battery cell connected to a lowest potential side.

9. The voltage detecting circuit according to claim 1, further comprising:

a register that stores respective voltage values of the plurality of battery cells measured by the measuring part, wherein the voltage detecting circuit sequentially measures the plurality of battery cells in a predetermined cycle, and stores results of a measurement in the register, and wherein the voltage detecting circuit outputs the value stored in the register in response to a request from another circuit.

10. The voltage detecting circuit according to claim 1, wherein the correction capacitor absorbs an excessive charge accumulated in a transfer path between the one of the plurality of battery cells and the measuring part, while the transfer switch is ON to transfer the potential difference of the sampling capacitor to the measuring part.

11. The voltage detecting circuit according to claim 1, wherein the correction capacitor is different from the sampling capacitor.

12. A voltage detecting circuit, comprising:

a switch group that selects any one of a plurality of battery cells connected in series;

a sampling capacitor that maintains a potential difference between a positive electrode terminal and a negative electrode terminal of a battery cell selected by the switch group;

a measuring part that outputs a detected voltage value signal corresponding to a potential difference between ends of the sampling capacitor;

a transfer switch that transfers, to the measuring part, the potential difference between the ends of the sampling capacitor;

a correction capacitor provided in parallel to input terminals of the measuring part, and between the transfer switch and the measuring part; and a discharge switch provided in parallel to the correction capacitor, and controlled so that a switching condition of the discharge switch is mutually exclusive with that of the transfer switch, wherein a capacity value of the correction capacitor is determined in accordance with a potential difference between a potential of a positive electrode terminal of a battery cell corresponding to a high potential side transfer switch, and a potential of a negative electrode terminal of a battery cell connected to a lowest potential side.

13. The voltage detecting circuit according to claim 12, wherein the positive electrode terminal is connected to the correction capacitor.

14. The voltage detecting circuit according to claim 12, wherein the capacity value of the correction capacitor is switchable to a larger value in a case of a measurement of a battery cell connected to a high potential side of the plurality of battery cells.

15. The voltage detecting circuit according to claim 1, wherein the transfer switch comprises:

a plurality of high potential side transfer switches that each connects a high potential side terminal of the sampling capacitor to a high potential side input terminal of the measuring part.

16. The voltage detecting circuit according to claim 15, wherein a number of the high potential side transfer switches corresponds to a number of the plurality of battery cells.

17. The voltage detecting circuit according to claim 16, wherein the correction capacitor and the discharge switch are connected to said each of the high potential side switches except for the high potential side transfer switch corresponding to a battery cell connected to the lowest potential side.

* * * * *